US009755661B1

(12) United States Patent
Cai et al.

(10) Patent No.: US 9,755,661 B1
(45) Date of Patent: Sep. 5, 2017

(54) METHOD FOR CODING DATA

(71) Applicant: Macau University of Science and Technology, Taipa (MO)

(72) Inventors: Zhanchuan Cai, Taipa (MO); Ting Lan, Taipa (MO)

(73) Assignee: Macau University of Science and Technology (MO)

( * ) Notice: Subject to any disclaimer, the term of this patent is extended or adjusted under 35 U.S.C. 154(b) by 0 days.

(21) Appl. No.: 15/238,033

(22) Filed: Aug. 16, 2016

(51) Int. Cl.
| | |
|---|---|
| *H03M 7/30* | (2006.01) |
| *G10L 19/00* | (2013.01) |
| *G09G 5/02* | (2006.01) |
| *G06F 17/22* | (2006.01) |

(52) U.S. Cl.
CPC ....... *H03M 7/3082* (2013.01); *G06F 17/2217* (2013.01); *G06F 17/2223* (2013.01); *G09G 5/02* (2013.01); *G10L 19/00* (2013.01); *G10L 2019/0013* (2013.01)

(58) Field of Classification Search
CPC .......................... H03M 7/3082; H03M 7/3057
USPC ............................................. 341/87, 50, 51
See application file for complete search history.

(56) References Cited

U.S. PATENT DOCUMENTS

| | | | | |
|---|---|---|---|---|
| 8,983,188 | B1 * | 3/2015 | Lang | ........................ G06T 5/002 382/167 |
| 2006/0013505 | A1 * | 1/2006 | Yau | ..................... G06K 9/00214 382/285 |
| 2011/0090337 | A1 * | 4/2011 | Klomp | .................. G01C 11/025 348/144 |
| 2012/0110025 | A1 * | 5/2012 | Reznik | ................ H03M 7/4037 707/797 |
| 2013/0322754 | A1 * | 12/2013 | Lee | ........................ G06T 7/0081 382/171 |

OTHER PUBLICATIONS

X. Liu and W. Wang, "Robustly Extracting Captions in Videos Based on Stroke-Like Edges and Spatio-Temporal Analysis", IEEE Transactions on Multimedia, vol. 14, No. 2, Apr. 2012, pp. 482-489.
L. Su, C-C. M. Yeh, J-Y. Liu, J-C. Wang, and Y-H. Yang, "A Systematic Evaluation of the Bag-of-Frames Representation for Music Information Retrieval", IEEE Transactions on Multimedia, vol. 16, No. 5, Aug. 2014, pp. 1188-1200.
W. Zeng, K. Nahrstedt, P. A. Chou, A. Ortega, P. Frossard, and H. H. Yu, "Introduction to the Special Issue of Streaming Media", IEEE Transactions on Multimedia, vol. 6, No. 2, Apr. 2004, pp. 225-229.

(Continued)

*Primary Examiner* — Peguy Jean Pierre
(74) *Attorney, Agent, or Firm* — Renner Kenner Greive Bobak Taylor & Weber

(57) ABSTRACT

A method for coding data includes: representing a first data in digital form as digital information; transforming the digital information into a first Gaussian integer; determining a relationship between the first Gaussian integer and a second Gaussian integer; and deriving, based on the determined relationship, a key for converting between the first Gaussian integer and the second Gaussian integer so as to associate the first data with a second data represented by the second Gaussian integer. The present invention also provides a system and a non-transient computer readable medium for implementing the method.

20 Claims, 7 Drawing Sheets

(56) References Cited

OTHER PUBLICATIONS

G. Bucci, R. Detti, V. Pasqui, and S. Nativi, "Sharing Multimedia Data Over a Client-Server Network", IEEE Transactions on Multimedia, vol. 1, No. 3, 1994, pp. 44-55.
J. C. Lagarias and Y. Wang, "Nonnegative Radix Representations for the Orthant R+n", Transactions of the American Mathematical Society, vol. 348, No. 1, Jan. 1996, pp. 99-117.
A. M. Odlzyko, "Non-Negative Digit Sets in Positional Number Systems", Proceedings of the London Mathematical Society vol. 3, No. 37, 1978, pp. 213-229.
A. Barbe' and F. Von Haeseler, "Binary Number Systems for Z k", Journal of Number Theory, vol. 117, No. 1, 2006, pp. 14-30.
G. Bergman, "A Number System with an Irrational Base", Mathematics Magazine, vol. 31, No. 2, 1957, pp. 98-110.
V. S. Dimitrov and G. A. Jullien, "Loading the Bases: A New Number Representation with Applications", IEEE Circuits and Systems Magazine, vol. 3, No. 2, 2003, pp. 6-23.
M. Berman, "Adoption of the Octal Number System", IEEE Transactions on Computers, C-20, No. 5, 1971, pp. 593-598.
W. Parry, "On the B-Expansions of Real Numbers", Acta Mathematica Hungarica, vol. 11, No. 3, 1960, pp. 401-416.
I. Katai and J. Szabo, "Canonical Number Systems for Complex Integers", Acta Scientiarum Mathematicarum, vol. 37, Nos. 3-4, 1975, pp. 255-260.
W. Gilbert, "Complex Numbers with Three Radix Expansions", Canadian Journal of Mathematics, vol. 34, No. 6, 1982, pp. 1335-1348.
W. J. Gilbert, "Fractal Geometry Derived from Complex Bases", Mathematical Intellingencer, vol. 4, No. 2, 1982, pp. 78-86.

C. Heuberger, H. Prodinger, and S. G. Wagner, "Positional Number Systems with Digits Forming an Arithmetic Progression", Monatshefte fur Mathematik, vol. 155, No. 3, 2008, pp. 349-375.
C. Jin, D. Zhang, and M. Pan, "Chinese Text Information Hiding Based on Paraphrasing Technology", 2010 International Conference of Information Science and Management Engineering (ISME), 1 (2010), pp. 39-42.
P. V. K. Borges, J. Mayer, and E. Izquierdo, "Robust and Transparent Color Modulation for Text Data Hiding", IEEE Transactions on Multimedia, vol. 10, No. 8, Dec. 2008, pp. 1479-1489.
R. Nishimura, "Audio Information Hiding Based on Spatial Masking", 2010 Sixth International Conference on Intelligent Information Hiding and Multimedia Signal Processing (IIH-MSP), 2010, pp. 522-525.
M. A. Akhaee, M. J. Saberian, S. Feizi, and F. Marvasti, "Robust Audio Data Hiding Using Correlated Quantization with Histogram-Based Detector", IEEE Transactions on Multimedia, vol. 11, No. 5, Aug. 2009, pp. 834-842.
Q. Xue, G. Zhang, and X. Wang, "Research of Image Information Hiding Algorithm Based on Quadrilateral Partition", 2014 IEEE International Conference on Cloud Computing and Intelligence Systems (CCIS), 2014, pp. 495-498.
M. Qi, Y. Lu, N. Du, Y. Zhang, C. Wang, and J. Kong, "A Novel Image Hiding Approach Based on Correlation Analysis for Secure Multimodal Biometrics", Journal of Network and Computer Applications, vol. 33, No. 3, 2010, pp. 247-257.
X-Y. Li, L-X. Deng, R. Xu, and X-M. Li, "An Audio Information Hiding Scheme with High-Rui Xu2, Xue-Mei Li1 Capacity Based on Compressed Sensing and Psychoacoustic Model", 2014 7th International Congress on Image and Signal Processing, 2014, pp. 1095-1099.

* cited by examiner

METHOD FOR CODING DATA

TECHNICAL FIELD

The present invention relates to a method for coding data and particularly, although not exclusively, to a method for coding multimedia information using complex number basis.

BACKGROUND

Computer systems are usually stored with different types of basic information, such as text, graphics (images, video), and sound. These different types of basic information are generally represented by codes. In computer science, the representation of information can be considered as coding of information data.

Coding can allow various information be represented using a simple combination of symbols. In information coding, the two key elements are symbol type and combination rules.

SUMMARY OF THE INVENTION

In accordance with a first aspect of the present invention, there is provided a method for coding data, comprising: representing a first data in digital form as digital information; transforming the digital information into a first Gaussian integer; determining a relationship between the first Gaussian integer and a second Gaussian integer; and deriving, based on the determined relationship, a key for converting between the first Gaussian integer and the second Gaussian integer so as to associate the first data with a second data represented by the second Gaussian integer.

In one embodiment of the first aspect, the method further comprises converting the first data to the second data, In one embodiment of the first aspect, the method further comprises representing the first data using the second data represented by the second Gaussian integer so as to hide at least some of the first data.

In one embodiment of the first aspect, the relationship is a geometric relationship.

In one embodiment of the first aspect, the digital information is represented in one of: binary basis, octal basis, decimal basis, or hexadecimal basis.

In one embodiment of the first aspect, the transformation of the digital information into a Gaussian integer is based on complex number basis using complex numbers.

In one embodiment of the first aspect, the complex number basis has a base of $-1+i$ or $-1-i$.

In one embodiment of the first aspect, the key is a third Gaussian integer.

In one embodiment of the first aspect, the first data and the second data each comprises text, image, or audio.

In one embodiment of the first aspect, the image is a binary image; and the step of representing the first data in digital form as digital information comprises representing each pixel of the binary image using binary numbers.

In one embodiment of the first aspect, the image is a greyscale image; and the step of representing the first data in digital form as digital information comprises representing each pixel of the greyscale image using binary numbers.

In one embodiment of the first aspect, the image is a colour image; and the step of representing the first data in digital form as digital information comprises decomposing each pixel of the colour image into at least two separate colour components, and representing the at least two separate colour components of each pixel using binary numbers.

In one embodiment of the first aspect, the first data is text that comprises at least one of: a Chinese character, an English alphabet, a number, and a graphical symbol.

In one embodiment of the first aspect, the text is a Chinese character; and the step of representing the first data in digital form as digital information comprises representing the Chinese character using internal code with hexadecimal basis.

In one embodiment of the first aspect, the text is an English alphabet, a number, or a graphical symbol; and the step of representing the first data in digital form as digital information comprises representing the English alphabet, the number, or the graphical symbol using an ASCII code with binary basis.

In one embodiment of the first aspect, the audio is a digitized audio signal represented in voltage value; and the step of representing the first data in digital form as digital information comprises representing the digitized audio signal in a binary sequence using SQL code.

In one embodiment of the first aspect, the first data represented by the first Gaussian integer and the second data represented by the second Gaussian integer are of the same type.

In accordance with a second aspect of the present invention, there is provided a system for coding data, comprising one or more processors arranged to: represent a first data in digital form as digital information; transform the digital information into a first Gaussian integer; determine a relationship between the first Gaussian integer and a second Gaussian integer; and derive, based on the determined relationship, a key for converting between the first Gaussian integer and the second Gaussian integer so as to associate the first data with a second data represented by the second Gaussian integer.

In one embodiment of the second aspect, the first data and the second data each comprises text, image, or audio.

In one embodiment of the second aspect, the system further comprises a display for displaying text or image.

In one embodiment of the second aspect, the system further comprises a speaker for playing audio signals.

In accordance with a third aspect of the present invention, there is provided a non-transient computer readable medium for storing computer instructions that, when executed by one or more processors, causes the one or more processors to perform a method for coding data, the method comprising: representing a first data in digital form as digital information; transforming the digital information into a first Gaussian integer; determining a relationship between the first Gaussian integer and a second Gaussian integer; and deriving, based on the determined relationship, a key for converting between the first Gaussian integer and the second Gaussian integer so as to associate the first data with a second data represented by the second Gaussian integer.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

Figure 1:
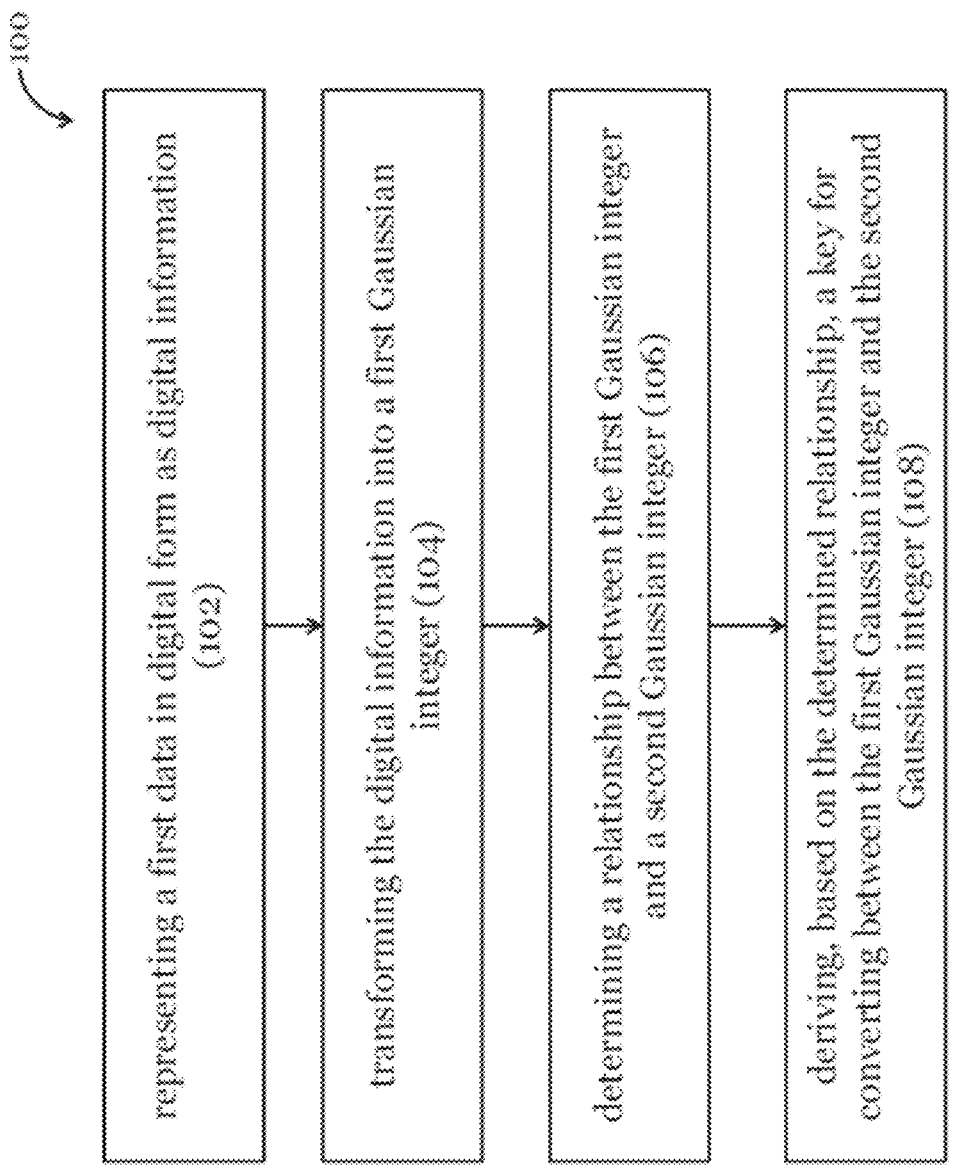
FIG. 1 is a flow diagram showing the data coding method in accordance with one embodiment of the present invention.

FIG. 1 illustrates a method 100 for coding data in accordance with one embodiment of the present invention. The method 100 begins in step 102, in which the first data is represented in digital form as digital information. The digital information is preferably represented in one of: binary basis, octal basis, decimal basis, or hexadecimal basis. Then, in step 104, the digital information is transformed into a first Gaussian integer. The transformation is preferably based on complex number basis using complex numbers. In a preferred embodiment, the complex number basis has a base of −1+i or −1−i. In step 106, a relationship between the first Gaussian integer and a second Gaussian integer is determined. Preferably, the relationship is a geometric relationship which involves at least one of addition, subtraction, multiplication, and division. Subsequently, in step 108, a key for converting between the first Gaussian integer and the second Gaussian integer is determined based on the determined relationship. The key is preferably also a Gaussian integer. By performing method 100, the first data can be associated with a second data represented by the second Gaussian integer.

In some embodiments, the method 100 may further comprise the step of converting the first data to the second data. In some embodiments, the method 100 may further comprise the step of representing the first data using the second data represented by the second Gaussian integer so as to hide at least some of the first data. In one embodiment, the first data is private data belonging in a private domain, and the second data is public data belong in a public domain.

The first data and the second data may each comprise image, text, or audio. The image may be a binary image, a greyscale image, a colour image, a 2D image, a 3D image, etc. The image may comprise of multiple smaller images. The text may comprise at least one of: a Chinese character, an English alphabet, a number, and a graphical symbol. The audio may be a digitized audio signal. Preferably, the first data represented by the first Gaussian integer and the second data represented by the second Gaussian integer are preferably of the same type.

Figure 2:
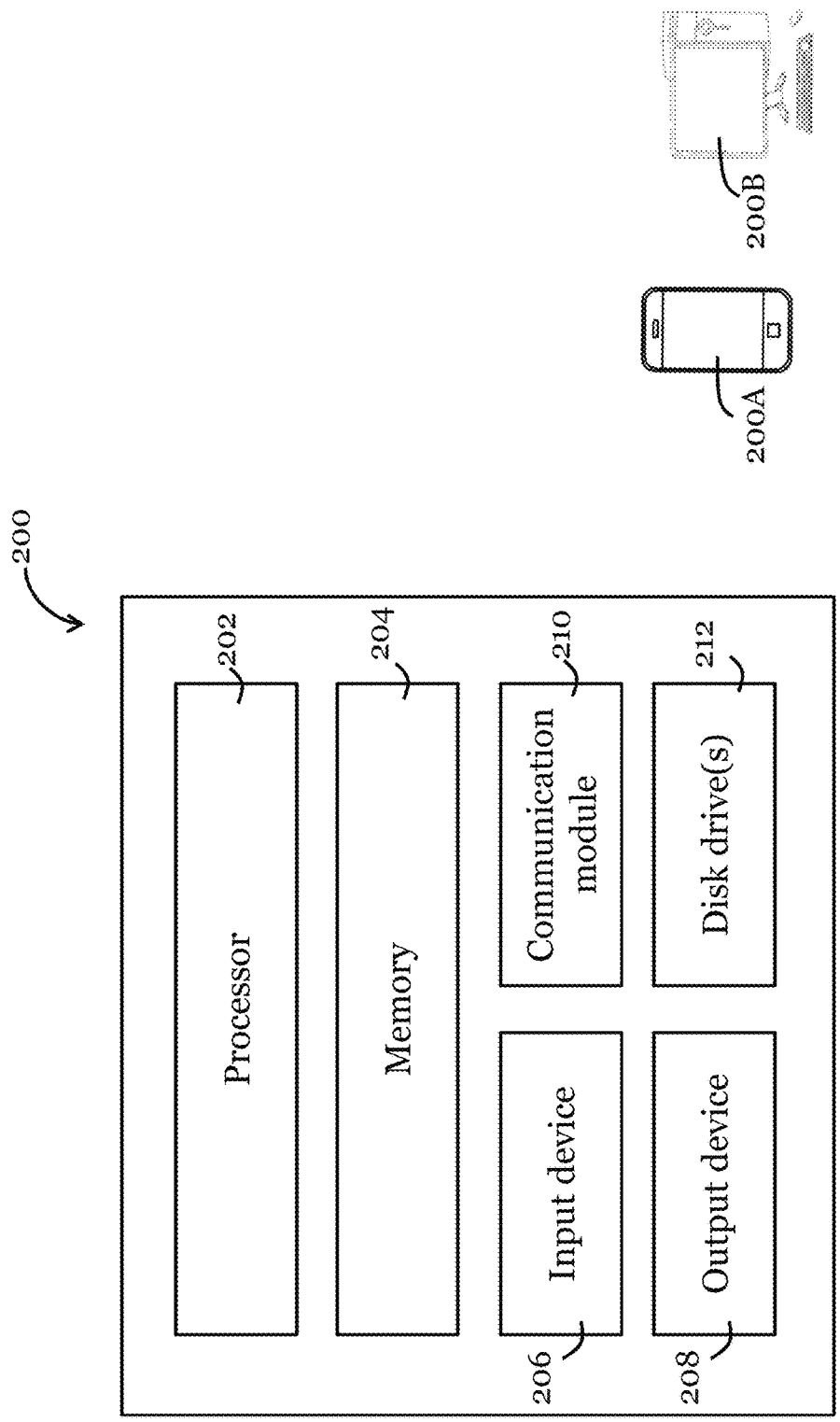
FIG. 2A is a functional block diagram of an information handling system for implementing the method of FIG. 1 in accordance with one embodiment of the present invention.
FIG. 2B illustrates two exemplary information handling systems adapted to implement the method of FIG. 1 in accordance with one embodiment of the present invention.

Referring to FIG. 2A, there is shown a schematic diagram of an exemplary information handling system 200 that can be used for implementing the method 100 in one embodiment of the present invention. The information handling system 200 can have different configurations, and it generally comprises suitable components necessary to receive, store and execute appropriate computer instructions or codes. The main components of the information handling system 200 are a processing unit 202 and a memory unit 204. The processing unit 202 is a processor such as a CPU, an MCU, etc. The memory unit 204 may include a volatile memory unit (such as RAM), a non-volatile unit (such as ROM, EPROM, EEPROM and flash memory) or both. Preferably, the information handling system 200 further includes one or more input devices 206 such as a keyboard, a mouse, a stylus, a microphone, a tactile input device (e.g., touch sensitive screen) and a video input device (e.g., camera). The information handling system 200 may further include one or more output devices 208 such as one or more displays, speakers, disk drives, and printers. The displays may be a liquid crystal display, a light emitting display or any other suitable display that may or may not be touch sensitive. The information handling system 200 may further include one or more disk drives 212 which may encompass solid state drives, hard disk drives, optical drives and/or magnetic tape drives. A suitable operating system may be installed in the information handling system 200, e.g., on the disk drive 212 or in the memory unit 204 of the information handling system 200. The memory unit 204 and the disk drive 212 may be operated by the processing unit 202. The information handling system 200 also preferably includes a communication module 210 for establishing one or more communication links (not shown) with one or more other computing devices such as a server, personal computers, terminals, wireless or handheld computing devices. The communication module 210 may be a modem, a Network Interface Card (NIC), an integrated network interface, a radio frequency transceiver, an optical port, an infrared port, a USB connection, or other interfaces. The communication links may be wired or wireless for communicating commands, instructions, information and/or data. Preferably, the processing unit 202, the memory unit 204, and optionally the input devices 206, the output devices 208, the communication module 210 and the disk drives 212 are connected with each other through a bus, a Peripheral Component Interconnect (PCI) such as PCI Express, a Universal Serial Bus (USB), and/or an optical bus structure. In one embodiment, some of these components may be connected through a network such as the Internet or a cloud computing network.

A person skilled in the art would appreciate that the information handling system 200 shown in FIG. 2A is merely exemplary and that different information handling system s 200 may have different configurations and still be applicable in the present invention.

FIG. 2B shows two exemplary information handling systems, one in the form of a tablet computer 200A, and one in the form of a desktop computer 200B.

The following description provides a detailed disclosure and illustration on the data coding method in accordance with a preferred embodiment of the present invention.

I. Positional Number System

In a positional number system, a set of numerical symbols or characters is used to represent numbers or values. Usually, an ideal notation can be used to describe a set of numbers effectively. Examples of these notations include natural number, integer, real number, complex number and rational number, each of which corresponds to a unique representation. On the other hand, positional notation, basis notation, and place-value notation are used for representation and coding of numbers. These notations are based on the basis and the limited set of digital symbols respectively. One well-known system is the integer basis, which uses 'a' (a∈0, 1, 2, . . . ) numerical symbols to represent numbers. In general, a basis 'a' numeral system has a basis 'a'. One example is the decimal system which has a basis of ten. It uses ten numerical symbols: 0-9, and the basic numerical symbol set is $\{0, 1, 2, 3, 4, 5, 6, 7, 8, 9\}$. Another example is the binary numeral system which has a basis of two. Its basic numerical symbol set is $\{0, 1\}$. Further examples include the octal system and the hexadecimal system, and their basic numerical symbol sets contain $\{0, 1, 2, 3, 4, 5, 6, 7\}$ and $\{0, 1, 2, 3, 4, 5, 6, 7, 8, 9, A, B, C, D, E, F\}$ respectively.

Each numerical symbol has a unique counting unit, and is associated with a weight that is dependent on its position in the number sequence. The weight for each position is expressed as the power of the basis. In the decimal system, the weight of the 'units' position is $10^0$, the weight of the 'tens' position is $10^1$, etc. In the fractional part, the weights are $10^{-1}$, $10^{-2}$, etc., progressing from left to right after the decimal place. In the binary system, the weight of the second position is 2, the weight of the third position is $2^2$, the weight of the fourth position is $2^3$, etc.

Generally, in a basis 'a' numeral system, the weight of the i-th position in the non-fractional part is $a^{i-1}$ and the weight of the i-th position in the fractional part is $a^{-i}$. Thus, numbers in a basis 'a' system can be represented as:

$$(e_n e_{n-1} \ldots e_1 e_0 \cdot f_0 f_1 \ldots)_a = \sum_{k=0}^{n} e_n a^k + \sum_{k=1}^{\infty} f_n a^{-k} \quad (1)$$

where the numbers $a^k$ and $a^{-k}$ are the weights of the corresponding digits.

In the decimal system, every non-negative integer N has a unique decimal representation of:

$$N = n_p \times 10^p + n_{p-1} \times 10^{p-1} + \ldots + n_1 \times 10^1 + n_0 \times 10^0 \quad (2)$$

where $n_k \in S = \{0, 1, 2, \ldots, 9\}$, $k = 0, 1, 2, \ldots, p$.

And in simplified form, it can be represented as:

$$N = (n_p n_{p-1} n_{p-2} \ldots n_1 n_0)_{10} \quad (3)$$

In the binary system, the arbitrary non-negative integer N has a general form of:

$$N = n_p \times 2^p + n_{p-1} \times 2^{p-1} + \ldots + n_1 \times 2^1 + n_0 \times 2^0 \quad (4)$$

where $n_k \in S = \{0, 1\}$ and $k = 0, 1, 2, \ldots, p$.

And in simplified form, it can be represented as:

$$N = (n_p n_{p-1} n_{p-2} \ldots n_1 n_0)_2 \quad (5)$$

The general form of an arbitrary non-negative integer N when using the letters a as basis can be expressed as:

$$N = n_p \times a^p + n_{p-1} \times a^{p-1} + \ldots + n_1 \times a^1 + n_0 \times a^0 \quad (6)$$

In one embodiment, any positive integer can be used as basis. In fact, $r_0 \in S = \{0, 1, 2, \ldots, a-1\}$ and non-negative integer $N_1$ can be found for any non-negative integers N, and $N = N_1 a + r_0$. If the minimum numeral symbol set ($S = \{0, 1, 2, \ldots, a-1\}$) has this nature, it is called complete residue system modulo 'a'. Further, $r_1 \in S = \{1, 2, \ldots, a-1\}$ and non-negative integer $N_2$ can be found, and $N_1 = N_2 a + r_1$. After limited steps, $r_k \in S = \{1, 2, \ldots, a-1\}$ and $r_{k-1} \in S = \{1, 2, \ldots, a-1\}$ can be obtained, and $N_{k-1} = N_k a + r_{k-1}$, $N_k = N_{k+1} a + r_k$. If $N_k < a$, then $N_{k+1} = 0$. Subsequently, the following equation can be obtained:

$$N = r_k \times a^k + r_{k-1} \times a^{k-1} + \ldots + r_1 \times a^1 + r_0 \times a^0 \quad (7)$$

And in simplified form, it can be represented as:

$$N = (r_k r_{k-1} r_{k-2} \ldots r_1 r_0)_a \quad (8)$$

The above provides a general overview of a basis 'a' numeral system. A person skilled in the art would appreciate that when a equals to two, the system is binary; when a equals to four, the system is quaternary; when a equals to five, the system is quinary, etc.

II. Complex Number Coding

Various embodiments of the present invention relate to complex number coding, in which the concept of basis is applied to complex numbers. If x and y are real numbers, then $z = x + iy$ is the Gaussian integer, where i is the imaginary unit with $i^2 = -1$. In the following, letter b is used to represent complex number basis. According to the positional number system, the Gaussian integer can be written as $Z = \sum_{j=0}^{k} r_j b^j$, where $k = 0, 1, 2, \ldots$, and Z can be represented using basis 'b'. In the Z representation, if all allowed $r_j$ are the complete residue system modulo 'b', then the standard Algorithm of representation number based on the integer basis can be extended to the complex number basis.

In the complex number basis of one embodiment, all of the Gaussian integers can be represented when $b = -n + i$ and $b = -n - i$ (where n is positive integer). If all complex numbers can be represented by a basis then this basis is called an appropriate basis. Examples of this appropriate basis include $b = -1 + i$ and $b = -1 - i$. Otherwise, the basis is called an inappropriate basis. Examples of this inappropriate basis include $b = 1 - i$ and $b = 1 + i$.

When operating with Gaussian integers $U_0 + iV_0$, it is necessary to consider the type of complex number basis ($b = \xi + i\eta$, where $\xi$ and $\eta$ are non-zero integer) that is available. Gauss has proven in early times that, if $\xi$ and $\eta$ are co-prime, then $S = \{0, 1, 2, \ldots, \xi^2 + \eta^2 - 1\}$ is the complete residue system modulo '$b = \xi + i\eta$'. Otherwise, if $\xi$ and $\eta$ share common factors, then the common factors are divided into both $\xi$ and $\eta$. Effectively, the complete residue system modulo '$b = \xi + i\eta$' must contain a number, and the imaginary part of the number is non-zero. In order to represent Gaussian integers based on complex number basis as much as possible, it is preferred that $\eta = \pm 1$ as $\eta$ divides into the imaginary part of 'b' basis's power $(\xi + i\eta)^j$. In another example, basis $b = \xi \pm i$, and the numeral symbol set $S = \{0, 1, 2, \ldots, \xi^2\}$.

Considering $S = \{0, 1\}$ then $\xi = \pm 1$ and $\eta = \pm 1$. Preferably, only four complex number basis b are considered: $1 + i$, $1 - i$, −1+i and −1−i. In these four complex number basis, −1+i and −1−i are appropriate basis and they are conjugate with each other. 1+i and 1−i are not appropriate basis.

In the following description, b=−1+i is selected as the complex number basis. This selection is based on the characteristics of digital computer and it allows all complex numbers to be represented. However, in other embodiments other complex number basis b can be used. Preferably, any Gaussian integers 'N' can be represented as follows:

$$N = \sum_{j=0}^{k} r_j b^j = (r_k r_{k-1} r_{k-2} \ldots r_1 r_0)_b \qquad (9)$$

where $r_j \epsilon S = \{0, 1\}$, $j=0, 1, 2, \ldots, k$.

A number based on $basis_{(1)}$ can be converted to Gaussian integer based on $basis_{(3)}=-1+i$. A detailed conversion Algorithm is illustrated in Algorithm 1.

---

Algorithm 1 Conversion of different positional notations algorithm

---

1: A is the original number
2: B is the converted number
3: $basis_{(1)}$ is the basis of original number
4: $basis_{(2)}$ = 2
5: $basis_{(3)}$ = −1 + i
6: function CONVERT(A to B)
7:    for i = 0 and A[i] ≠ '\0' and i + + do
8:       in A[i] >' 0' and A[i] <' 9' then
9:          j = A[i] −' 0'
10:       else
11:          j = A[i] −' A' + 10
12:       end if
13:       number = number * $basis_{(1)}$ + t
14:    end for
15: end function
16: function number( )
17:    t = number % $basis_{(2)}$
18:    if t ≥ 0 and t ≤ 9 then
19:       B[i + +] = t +' 0'
20:    else
21:       B[i + +] = t +' A' − 10
22:    end if
23:    number = number/$basis_{(2)}$;
24: end function
25: function Gaussian integer(N)
26:    $(r_k r_{k-1} r_{k-2} \ldots r_1 r_0)_2$ = B
27:    for j = 0 and j ≤ k and j + + do
28:       $N = \Sigma_{j=0}^{k} r_j basis_{(3)}^j$
29:    end for
30: end function

---

A conversion between binary, decimal, and complex number basis b = −1 + i is shown in Table I.

TABLE I

Conversion of the positional number system

| Decimal | Binary | basis: b = −1 + i |
|---|---|---|
| 0 | 0 | 0 |
| 1 | 1 | 1 |
| 2 | 10 | −1 + i |
| 3 | 11 | i |
| 4 | 100 | −2i |
| 5 | 101 | 1 − 2i |
| 6 | 110 | −1 − i |
| 7 | 111 | −i |
| 8 | 1000 | 2 + 2i |
| 9 | 1001 | 3 + 2i |
| 10 | 1010 | 1 + 3i |
| 11 | 1011 | 2 + 3i |

TABLE I-continued

Conversion of the positional number system

| Decimal | Binary | basis: b = −1 + i |
|---|---|---|
| 12 | 1100 | 2 |
| 13 | 1101 | 3 |
| 14 | 1110 | 1 + i |
| 15 | 1111 | 2 + i |
| … | … | … |

III. Digital Conversion Algorithm Based on Complex Number Basis

A. Gaussian Integer to Digital Information

A Gaussian integer is a complex number where its real and imaginary parts are both non-zero integers. Preferably, Gaussian integer may be used to represent digital information with complex number basis ($b=\xi+i\eta$), where $\xi=\pm 1$ and $\eta=\pm 1$. Let Gaussian integer be $U_0+iV_0$, then its 0~1 sequence is $(e_n e_{n-1} \ldots e_1 e_0)$. In order to determine $\{e_j\}$, j=0, 1, …, n, let $U_0+iV_0$ be:

$$U_0+iV_0 = e_n \times b^n + e_{n-1} \times b^{n-1} + \ldots + e_1 \times b^1 + e_0 \times b^0) \qquad (10)$$

Applying a recursive calculation method, equation (10) can be rewritten as follows:

$$U_0+iV_0 = (\xi+i\eta)(U_1+iV_1)+e_0$$

$$= \xi U_1 - \eta V_1 + (\eta U_1 + \xi V_1)i + e_0 \qquad (11)$$

where $e_0 \epsilon S = \{0, 1\}$, j=0, 1, 2, …, n.

Then $$U_0 = \xi U_1 - \eta V_1 + e_0$$

$$Q_0 = \eta U_1 + \xi V_1$$

and hence $$\begin{pmatrix} U_{k+1} \\ V_{k+1} \end{pmatrix} = \begin{pmatrix} \xi & \eta & -\xi \\ -\eta & \xi & \eta \end{pmatrix} \begin{pmatrix} \dfrac{U_k}{2} \\ \dfrac{V_k}{2} \\ \dfrac{e_k}{2} \end{pmatrix}$$

Preferably, the recursion formula can be expressed as follows:

$$U_{k+1} = \frac{\xi U_k + \eta V_k - \xi e_0}{2} \qquad (12)$$

$$V_{k+1} = \frac{-\xi U_k - \eta V_k + \xi e_0}{2}$$

where k=0, 1, 2, ….

In one example if the parity of $U_k$ and $V_k$ are same, then $e_k=0$, otherwise $e_k=1$. When $U_k=0$ and $V_k=0$, the recursive counting is stopped. The result is $e_n e_{n-1} e_{n-2} \ldots e_1 e_0$. When giving a Gaussian integer $(U_0+iV_0)$, its 0~1 sequence based on corresponding basis 'b' can be obtained using equation (12).

Equation (13) is the recursion formula when b=−1+i is used as the complex number basis.

$$U_{k+1} = \frac{U_k - V_k + e_0}{2} \quad (13)$$

$$V_{k+1} = \frac{-U_k - V_k + e_0}{2}$$

where k=0, 1, 2, . . . , $e_k = |(U_k - V_k) \bmod 2|$.

It should be noted that equation (13) is obtained from basis 'b=−1+i'. In other embodiments where other basis is used, the recursive equation will be changed accordingly.

An Algorithm for converting from Gaussian integer to digital information is shown in Algorithm 2.

Algorithm 2 Gaussian integer to digital information algorithm

```
1: Gaussian integer = U_0 + iV_0
2: basis b = −1 + i
3: function
4:   for k = 0 and ≤ n and k + + do
5:     U_{k+1} = (V_k − U_k + e_k)/2
6:     V_{k+1} = (−V_k + U_k + e_k)/2
7:     e_k = |(U_k − v_k) mod 2|
8:   end for
9:   0~1 sequence is e_n e_{n−1} ... e_1 e_0
10: end function
```

B. Digital Information to Gaussian Integer

If the 0~1 sequence ($e_n e_{n-1} e_{n-2} \ldots e_1 e_0$) of a digital information based on the complex number basis (b=ξ+iη), where ξ=±1, η=±1 is known, then the Gaussian integers can be calculated. In one embodiment, the Gaussian integers calculation process is as follows:

Let $(\xi+i\eta)^k = r_k + is_k$, where k=0, then $r_0=1$, $s_0=0$. Then, construct the recursion formula by the following:

Let $$(\xi+i\eta)^k = (\xi+i\eta)(r_{k-1}+is_{k-1})$$

$$= \xi r_{k-1} - \eta s_{k-1} + i(\eta r_{k-1} + \xi s_{k-1}) \quad (14)$$

Then, $$r_k = \xi r_{k-1} - \eta s_{k-1}$$

$$s_k = \eta r_{k-1} + \xi s_{k-1} \quad (15)$$

Thus, $$\begin{pmatrix} r_{k+1} \\ s_{k+1} \end{pmatrix} = \begin{pmatrix} \xi & -\eta \\ \eta & \xi \end{pmatrix} \begin{pmatrix} r_k \\ s_k \end{pmatrix}$$

Equation (16) can be obtained from equation (15) when b=−1+i is used as the complex number basis.

$$r_k = -r_{k-1} - s_{k-1}$$

$$s_k = r_{k-1} - s_{k-1} \quad (16)$$

From $$U_0 + iV_0 = e_n \times b^n + e_{n-1} \times b^{n-1} + \ldots +$$

-continued $$e_1 \times b^1 + e_0 \times b^0$$

$$= e_n \times (\xi+i\eta)^n + e_{n-1} \times (\xi+i\eta)^{n-1} + \ldots +$$

$$e_1 \times (\xi+i\eta)^1 + e_0 \times (\xi+i\eta)^0$$

$$= e_n(r_n + is_n) + e_{n-1}(r_{n-1} + is_{n-1}) + \ldots +$$

$$e_1(r_1 + is_1) + e_0$$

$$= e_n r_n + e_{n-1} r_{n-1} + \ldots + e_1 r_1 + e_0 +$$

$$i(e_n s_n + e_{n-1} s_{n-1} + \ldots + e_1 s_1)$$

The following equation is then obtained, $$U_0 = \sum_{j=0}^{n} e_j r_j \quad (17)$$

$$V_0 = \sum_{j=1}^{n} e_j s_j$$

Accordingly, $U_0+iV_0$ is the Gaussian integer of this 0~1 sequence based on the complex number basis 'b=ξ+iη'. In other words, the corresponding spot on the complex number plane for any given 0~1 sequences can be found.

It can be seen from the above example that any 0~1 sequences of digital information can be converted to a point on the complex number plane using equations (15) and (17). Conversely, any corresponding spot of Gaussian integers on the complex number plane can be converted to a 0~1 sequence using equation (12).

An Algorithm for converting from digital information to Gaussian integer is shown in Algorithm 3.

Algorithm 3 Digital information to Gaussian integer

```
1: 0~1 sequence = e_n e_{n−1} ... e_1 e_0
2: basis b = −1 + i
3: r_0 = 1
4: s_0 = 0
5: function
6:   for k =1 and k ≤ n and k + + do
7:     r_k = −r_{k−1} − s_{k−1}
8:     s_k = r_{k−1} − s_{k−1}
9:   end for
10:  for k = 0 and k ≤ n and k + + do
11:    U_0 = Σ_{k=0}^{n} e_k r_k
12:  end for
13:  for k = 1 and k ≤ n and k + + do
14:    V_0 = Σ_{k=1}^{n} e_k s_k
15:  end for
16:  Gaussian integer is U_0 + iV_0
17: end function
```

IV. Representation of Multimedia Information Based on Complex Number Basis

The method in the present embodiment relates to the projection of multimedia information (such as text, audio, and images) to a complex plane based on a selected complex number basis. Without loss of generality, the present embodiment uses 'b=−1+i' as the complex number basis and S={0, 1} as the numeral symbol set. A person skilled in the art would appreciate that, in some embodiments, other complex number basis and numeral symbol set may be used.

By converting digital information data to a point on the complex plane, the relationship between different digital information data can be considered as problem of plane geometry. After all, this projection is the projection of the 0~1 sequence to the corresponding mapped point on the complex plane. The data coding method in the present embodiment is thus applicable for different digital information including text, audio, images, videos, etc.

A. Text Information Based on Complex Number Basis

Computers usually store and operate with binary numbers: 0, 1. Texts (such as English alphabet, Chinese characters) that are used for communication cannot be stored in a computer directly. In order to solve the problem of storing texts in computer, the words in the text must be digitized, i.e., the words must be coded.

The following description uses Chinese characters and English alphabets as an example for illustration. A person skilled in the art would appreciate that other text, language, symbols, etc., are also applicable to the method in the present invention.

For Chinese characters, three types of coding are generally used on the computer. The first type is input code (Chinese characters outer code), which contains a set of western keyboard symbols (letters, numbers and special symbols). The second type is internal code (NeiMa), which is used to store, handle, and process Chinese characters in the computer. The third type is output code (character code), which is used to output Chinese characters. The operation result of binary coding of information needs to be converted by the character code before outputting on the output device. In the present embodiment, the internal code is used to represent the Chinese character on the complex plane. For example, the internal code of Chinese character '中' is 'D6D0', the internal code of Chinese character '科' is 'BFC6'. In the present embodiment, the internal code can be represented as a corresponding 0~1 sequence.

For English alphabet, there is a relative wider range of information, including 26 alphabetic characters, 10 numerical digits, and from 11 to 25 special graphic symbols. Preferably, these can be indicated using ASCII code. Generally, ASCII codes 128 specified characters into eight-bit integers, and usually the highest bit (parity bit) is set to 0. For example, the ASCII code of letter 'A' is '01000001', the ASCII code of number '9' is '00111001', and the ASCII code of symbol '!' is '00100001'.

The ASCII code of symbol '!' is 01000001. In this example, the corresponding real part and the corresponding imaginary part can be calculated using the method described in Section II. The result is that $$U_0 = \langle e, r \rangle = \sum_{j=0}^{n} e_j r_j = 5$$

$$V_0 = \langle e, s \rangle = \sum_{j=1}^{n} e_j r_j = -4$$

Accordingly, the symbol '!' is converted to a Gaussian integer ($Z_{(!)}=5-4i$) based on the complex number basis (b=−1+i). After that, it can be represented as coordinate is (5,−4) on the complex plane.

B. Audio Information Based on Complex Number Basis

Sounds are audio signals within the acoustic range available to humans. Their audio frequency is generally in the 20 to 20,000 hertz range. In an analog audio signal, sound is represented by a continuous waveform over time. The loudness of sound is reflected in the amplitude of the acoustic pressure, and the pitch is reflected in audio frequency. Analog audio signals are usually recorded and stored in computers or servers in the form of digital audio signals. A digital audio signal contains a number made up of binary numbers 1 and 0.

To apply the method in the present embodiment to an analog audio signal, the first step is to digitize (i.e., sample and quantize) the signal. In one example, the digitization is performed by sampling with a constant sampling rate.

Figures 3, 4, 5:
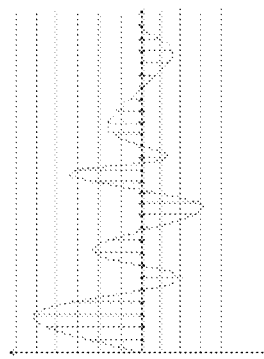
FIG. 3 is a graph illustrating sampling and quantization of an audio signal.
FIG. 4 is an illustration of six different linearization methods (a) to (f) for processing images based on the method in one embodiment of the present invention.
FIG. 5 is an illustration of pixel blocks of a grayscale image, before (left) and after (right) conversion.
Figure 7:
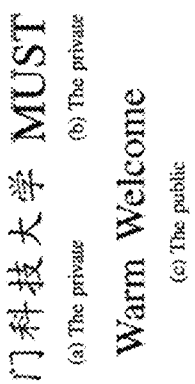
FIG. 7 shows some exemplary texts that can be coded using the method in one embodiment of the present invention.

In digital audio technology, the analog voltage of sound intensity is represented in digits in a quantization process. In other words, the magnitude of the voltage within a range may be represented by the same digit. The same principles can be applied to restore the analog data. FIG. 3 shows the sampling and quantization of an analog audio signal. In FIG. 3, the vertical axis represents voltage, and the voltage values between every two adjacent red lines have the same quantized value.

The basic number system in computers is binary. Thus, the audio data is coded as computer data format. In the present embodiment, SQL code is used to convert audio to the binary sequence, and to revert the binary sequence to audio. An exemplary SQL code is shown as follows:

Audio to binary sequence,
byte[ ] sequence=File.ReadAllBytes ("experimetal.wma");
Binary sequence to audio,
File.WriteAllBytes ("restoreexperimetal.wma", sequence);

The corresponding real part and imaginary part of the Gaussian number can be obtained using the method described in Section II. Thus, the resulting audio information can be represented on the complex plane.

C. Digital Image Based on Complex Number Basis

Digital images can be in different forms: binary image, grayscale image, color image, 2D image, 3D image, etc. The following description focuses on 2D digital images, including binary images, gray-scale images, and color images.

A 2D image is a representation of a two-dimensional matrix on a computer. Depending on size, resolution, format, etc., an image may contain a large amount of information. In order to express the image in complex number, it is necessary to transform the two-dimensional image signal to the 0~1 sequence of one-dimensional space. There are many ways in which this transformation can be performed. In one example, the transformation may be performed using linearization, a method that is particularly suitable for binary images and grayscale images. For color images, in one embodiment, the transformation may be performed separate for the R (red) component, the G (green) component, and the B (blue) component.

FIG. 4 illustrates six commonly used linearization schemes (a) to (f). In FIG. 4, there are six matrixes, each representing an image. Each of the matrixes includes 16 blocks, and each of the blocks corresponds to a pixel or a pixel block. The different sequence for linearization is illustrated in the matrixes using a line that draws through the blocks in the respective matrix.

FIG. 5 shows a 4×4 grayscale pixels block (left), and a binary block (right) transformed from the grayscale pixel block on the left.

By applying the linearization method (a) in FIG. 4 to FIG. 5, the following 0~1 sequence can be obtained: '10100011 10010011 10011000 10001001 10010001 10010010 1001010 10010000 10010010 10011001 10010101 10010111 10001110 10010111 10011011 10010110'

Starting from '10100011', the corresponding real part and the corresponding imaginary part can be calculated using the method described in Section II. The result is:

$$U_0 = \langle e, r \rangle = \sum_{j=0}^{n} e_j r_j = -5523029274283244717$$

$$V_0 = \langle e, s \rangle = \sum_{j=1}^{n} e_j r_j = -13215399108021942617$$

Essentially, the grayscale pixel block in FIG. 5 is converted to a Gaussian integer ($Z_{block}=-5523029274283244717-13215399108021942617$ i) based on the complex number basis b=−1+i. And it can now be represented in the coordinate of (−5523029274283244717, −13215399108021942617) on the complex plane.

In the present example, linearization method (a) in FIG. 4 is used to perform linearization for each pixels block in the image. However, in other embodiments, other linearization methods such as methods (b) to (d) in FIG. 4 can be used.

In one embodiment, a large image may first be divided into several small sub-images for separate processing. In this way, a large number arithmetic can be avoided, and the processing of integer weight will be smaller. Advantageously, this may improve the efficiency of the entire process.

V. Information Hiding Based on Complex Number Basis

The data coding method in the present embodiment may be extended to hide information.

A. Description of the Hiding Algorithm

In information hiding technology, secret or private information may be hidden by putting this information in an unsuspecting regular file (i.e. carrier file). The carrier file may be any computer-readable data, such as image files, documents, or digital audio.

Define the following characters and functions:

$M_1$ is a public information,

S is a private information,

Function G(x): x→N is a conversion function of binary encoding information,

Function $G^{-1}$(N): N→x is an inverse process of function of G(x),

Function $F_b$(N): N→(p, q) is a projection processing (in the present embodiment, it is the transformation of binary sequence of information to a point on the complex plane), Function $F^{-1}$(N): (p, q)→N is the inverse process of function of $F_b$(N), Function R ($P_0$, $P_1$): $P_0 \leftrightarrow P_1$ is defined as the relationship between $P_0$ and $P_1$.

The hiding method in one embodiment of the present invention is as follows: First, the function G(x) is used for the public information $M_1$. Then a sequence 0~1 is generated, denoted as $G(M_1)=N_{M_1}$. Next, the 0~1 sequence is converted to a point $P_0$ ($P_0$, $P_1$)=($p_0$, $q_0$) on the complex plane. This procedure is denoted as $F_{-1+i}(N_{M_1})=(p_0, q_0)=P_0$. By applying the same function for the private information S, $F_{-1+i}(N_S)=(p_1, q_1)=P_1$ is obtained. Thus, on the complex plane, the relationship (R($P_0$, $P_1$): $P_0 \leftrightarrow P_1$) between these two points can be found. The hiding object is represented by $M_1$, and the binary sequence of the secret file can be reconstructed and by a series of inverse transform functions. Because the 0~1 sequence and the point on the complex plane are mapped one to one, the inverse transform function will also be one to one.

The above processing in the present embodiment is illustrated in Algorithm 4 and Algorithm 5 below.

| Algorithm 4 Coding |
|---|
| 1: function ($M_1$) |
| 2:    $M_1 \to G(x) \to G(M_1) = N_{M_1}$ |
| 3:    $N_{M_1} \to F_{-1+i}(N_{M_1}) = (p_0, q_0) = P_0$ |
| 4: end function |
| 5: function (S) |
| 6:    $S \to G(x) \to G(S) = N_S$ |
| 7:    $N_S \to F_{-1+i}(N_S) = (p_1, q_1) = P_1$ |
| 8: end function |
| 9: The key is R($P_0$, $P_1$): $P_0 \leftrightarrow P_1$. |

| Algorithm 5 Decoding |
|---|
| 1: function |
| 2:    $M_1 \to G(x) \to G(M_1) = N_{M_1}$ |
| 3:    $N_{M_1} \to F_{-1+i}(N_{M_1}) = (p_0, q_0) = P_0$ |
| 4:    $P_1 : R(P_0, P_1) \leftrightarrow P_0$ |
| 5:    $P_1 \to F_b^{-1}(p_1, q_1) \to F_{-i+1}^{-1}(p_1, q_1) = N_S$ |
| 6:    $N_S \to G^{-1}(N) \to G^{-1}(N_S) = S$ |
| 7: end function |

B. Example of the Hiding Algorithm

Figure 6:
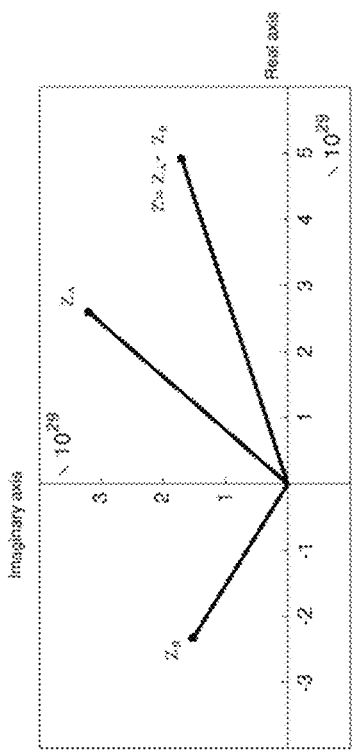
FIG. 6 is an illustration of hiding of data based on the method in one embodiment of the present invention.

An example of text information hiding based on the complex number basis is provided in the following description to demonstrate the transformation process. Using complex number basis b=−1+i, the text information 'A' is projected to a point on the complex plane $O_A=(x_A, y_A)$ and the text information 'B' is projected to a point on the complex plane $O_B=(x_B, y_B)$. The text information 'A($O_A$)' minus the text information 'B($O_B$)' is the difference vector $O'=O_A-O_B=(x_A-x_B, y_A-y_B)=(x', y')$ as shown in FIG. 6. In the present embodiment this difference vector is a key for converting between text information 'A($O_A$)' and text information 'B($O_B$)'. Preferably, the text information 'A' is private information and the text information 'B' is arbitrary and public information, and they do not appear to be related to each other. In the present embodiment, the private text message 'A' can be restored from the public text message 'B' and the key O, where $O_A=(x_A, y_A)=(x_B+x', y_B+y')$. It should be noted that the choice of the key (x', y')=($x_1-x_2$, $y_1-y_2$) in the present embodiment is merely exemplary. In some alternative embodiments, other geometric relationships may be used to obtain the key. In one example the relationship is addition, wherein (x", y")=($x_1+x_2$, $y_1+y_2$). In the present invention, a variety of selections for the keys are applicable, as long as the operational rules of plane geometry (e.g., addition, subtraction, multiplication, division, dot product of vector, cross product of vector, etc.) are observed. In one example, subtraction operation of plane geometry is used to achieve information hiding. In this example, the key is equal to the coordinates of private information on the complex plane minus the coordinates of public information on the complex plane.

Vi. Experiments and Analysis

A. Hiding of the Text Information

In the present example, Chinese characters '澳门科技大学' and English characters 'MUST' are selected as the private text information. The corresponding public text information is selected to be 'Warm Welcome'. In this example, the public text information appears to have no correlation with the confidential, private text information.

In operation, the Chinese characters '澳门科技大学' is first converted to Internal code, as: 'B0C4 C3C5 BFC6 BCBC B4F3 D1A7'. Then it is converted to a 0~1 sequence as '1011000011000100 1100001111000101 1011111111000110 1011110010111100 1011010011110011

1101000110100111'. By applying Algorithm 3, its representation of the complex plane based on basis (b=−1+i) can be obtained. In other words, the U values and V values can be obtained. The result is:

The real part $U_1 = -150115170289844$

The imaginary part $V_1 = -213248109241101$

Second, the English characters 'MUST' is converted to the ASCII code, as: '4D 55 53 54'. Then it is converted to a 0~1 sequence as '01001101 01010101 01010011 01010100'. By applying Algorithm 3, its representation of the complex plane based on basis (b=−1+i) can be obtained. The result is:

The real part $U_1 = 11452$

The imaginary part $V_1 = 34454$

Third, the public text information 'Warm Welcome' is converted to ASCII code, as: '57 61 72 6D 20 57 65 6C 63 6F 6D 65'. Then it is converted to a 0~1 sequence as '01010111 01100001 01110010 01101101 00100000 01010111 01100101 01101100 01100011 01101111 01101101 01100101'. By applying Algorithm 3, its representation of the complex plane based on basis (b=−1+i) can be obtained. The result is:

The real part $U_1 = -64908828457355$

The imaginary part $V_1 = 127903172154690$

After obtaining these results, the Gaussian integer of '澳门科技大学' is marked as $Z_1 = -150115170289844 - 213248109241101i$, the Gaussian integer of 'MUST' is marked as $Z_2 = 11452 + 34454i$, and the Gaussian integer of 'Warm Welcome' is marked as $Z_3 = -64908828457355 + 127903172154690i$. The key of the private Chinese information ('澳门科技大学') can be written as $Z' = Z_1 - Z_3$, and the key of the private English information (MUST) can be written as $Z'' = Z_2 - Z_3$. The private information '澳门科技大学' or 'MUST' can be restored from the public text information 'Warm Welcome' using Algorithm 2, provided that the key of Z', Z" and the Gaussian integer ($Z_3$) of 'Warm Welcome' are known. Subsequently, the Gaussian integer $Z_1$ or $Z_2$ of the private information can be obtained. With these, the private information '澳门科技大学' or 'MUST' can be restored using Algorithm 2. Accordingly, the method in the present embodiment enables the hiding and recovery of the private text information.

In one embodiment, to avoid processing large numbers operation, the original text information may be divided into a number of shorter text information so that they are dealt with separately. This is advantageous in that the weight of the processing of the integer may be reduced.

B. Hiding of the Audio Information

Audio information can also be represented on the complex plane. From the above description, audio information can be converted to the 0~1 sequence, and can be represented on the complex number basis (b=−1+i) when the 0~1 sequence is converted to a Gaussian integer. If the Gaussian integer of the private audio information is recorded as $Z_{a1}$ and the Gaussian integer of the public audio information is recorded as $Z_{a2}$, then in one embodiment the key for converting between the two can be written as $Z_a = Z_{a1} - Z_{a2}$. Likewise, private audio information can be restored provided that the key of $Z_a$ and the Gaussian integer ($Z_{a2}$) of the public audio information are known. Accordingly, the hiding and recovery of the private audio information can be performed.

Figure 8:
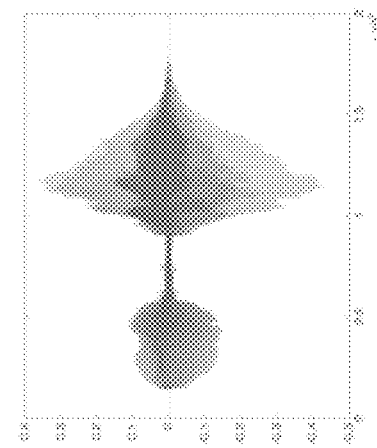
FIG. 8 is a plot showing a waveform of an audio signal containing public audio information.

FIG. 8 shows an exemplary waveform profile of a public audio information 'Hello', which can be represented as a Gaussian integer $Z_{a1} = U_{a1} + V_{a1}i$. By applying Algorithm 3, it can be determined that $U_{a1} = 3.6133 \times 102939$ and $V_{a1} = 3.6133 \times 102939$.

Figure 9:
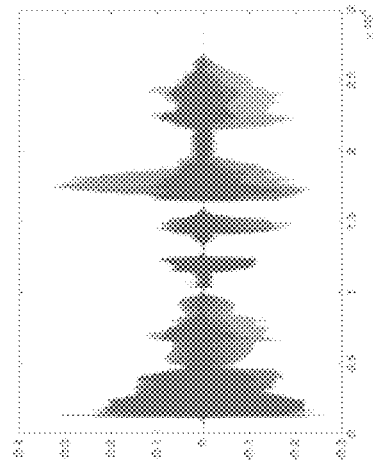
FIG. 9 is shows a plot showing a waveform of an audio signal containing private audio information.

FIG. 9 shows an exemplary waveform profile of a private audio information '澳门科技大学', and it can be represented as a Gaussian integer $Z_{a2} = U_{a2} + V_{a2}i$. By applying Algorithm 3, it can be determined that $U_{a2} = 1.0611 \times 104333$ and $V_{a2} = 3.3955 \times 104334$.

Once the values of $Z_{a1}$ and $Z_{a2}$ are known, the key $Z_a = Z_{a1} - Z_{a2}$ can be obtained. Again, in the present invention, a variety of selections for the keys are applicable, as long as the operational rules of plane geometry (e.g., addition, subtraction, multiplication, division, dot product of vector, cross product of vector, etc.) are observed.

C. Hiding of the Digital Image Information

1) Hiding of One Grayscale Image to Another Grayscale Image:

In the following example, all of the selected image are sized as 256×256 pixels, and the complex number basis is b=−1+i. The original public and private images are each divided into 8×8 pixels block, so as to avoid the processing of large numbers operation. In the present embodiment, the linearization method (a) of FIG. 4 is applied to a 8×8 pixels block.

Figure 10B:
FIG. 10B shows a greyscale image in private domain, corresponding to the public greyscale image of FIG. 10A.
Figure 11B:
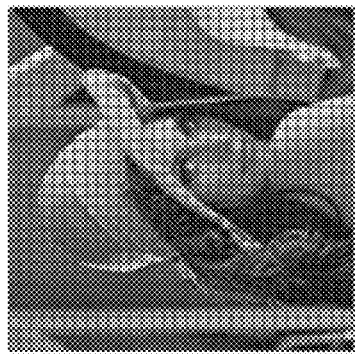
FIG. 11B shows the image of FIG. 10B overlaid with a pixel grid.
Figure 10A:
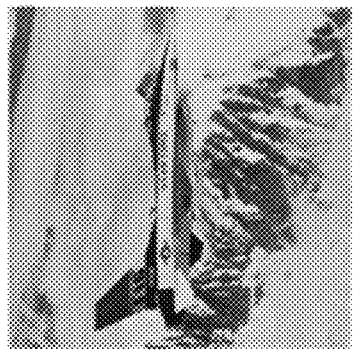
FIG. 10A shows a greyscale image in public domain.
Figure 11A:
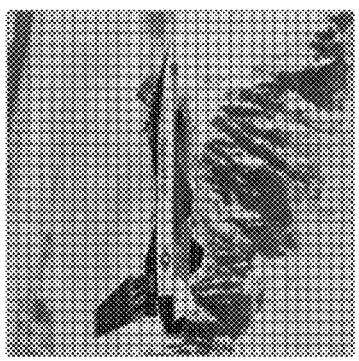
FIG. 11A shows the image of FIG. 10A overlaid with a pixel grid.

FIG. 10A is an independent public grayscale image, and FIG. 10B is the corresponding private grayscale image. The images in FIGS. 10A and 10B look substantially different such that they appear to be completely unrelated. Linearization is performed for each 8×8 pixels block of the private grayscale image and the public grayscale image using the linearization method (a) of FIG. 4. The blocked of grayscale image is shown in FIGS. 11A and 11B. In particular, the 0~1 sequence of each 8×8 pixels block is obtained from left to right, top to bottom, through all the pixels using the linearization method (a) of FIG. 4. These two grayscale images are then converted to a respective Gaussian integer based on the complex number basis (b=−1+i) using Algorithm 3. The first 8×8 pixels block in the upper left corner of the public grayscale image is represented as Gaussian integer $Z_{ga1}$. Similarly, the corresponding 8×8 pixels block of private grayscale image is represented as Gaussian integer $Z_{gb1}$. The Gaussian integer for other 8×8 pixels blocks in both the private and public grayscale image are obtained from left to right, top to bottom. The Gaussian integers obtained from the public grayscale image are arranged in a progression $Z_{ga}$. The Gaussian integers obtained from the private grayscale image are arranged in a progression $Z_{gb}$. The key $Z_{g1} = Z_{gb1} - Z_{ga1}$ is used for the first 8×8 pixels block. $Z_{gb1}$ is the first term of $Z_{gb}$ and $Z_{ga1}$ is the first term of $Z_{ga}$. The Gaussian integer progression of the key is recorded as $Z_g = Z_{gb} - Z_{ga}$. Accordingly, each progression includes a series of Gaussian numbers.

The private grayscale image of FIG. 10B can be restored. As the Gaussian integer progression ($Z_g$) of the key and the public grayscale image of FIG. 10A are known, Algorithm 2 and Algorithm 3 are used to restore the private grayscale image of FIG. 10B. Each of the 8×8 pixels blocks corresponds to the corresponding Gaussian integer. As such, the hiding and recovery of the private grayscale image are implemented using the method of the present embodiment.

For simplicity, only the first, second, and third term in each progressions are provided below. Using Algorithm 3, the following can be obtained:

$Z_{ga}=\{-4.4396\times10^{76}-9.2182\times10^{76}i,-5.4972\times10^{75}-7.9490\times10^{76}i,-6.7244\times10^{76}+6.3508\times10^{76}i,\ldots\}$, the progression $Z_{ga}$ has 1024 terms; and $Z_{gb}=\{-3.0878\times10^{76}-9.2634\times10^{76}i,-8.3981\times10^{76}-5.4513\times10^{76}i,-6.9975\times10^{76}-4.7261\times10^{77}i,\ldots\}$, the progression $Z_{gb}$ has 1024 terms.

It follows that the key is:

$Z_g=\{1.3518\times10^{76}+0.0454\times10^{76}i,-7.8484\times10^{76}+2.4977\times10^{76}i,-0.2729\times10^{76}-4.0910\times10^{77}i,\ldots\}$, the progression $Z_g$ has 1024 terms.

Figure 12B:
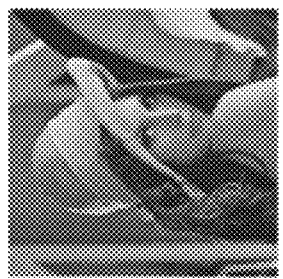
FIG. 12B shows a colour image in private domain, corresponding to the public color image of FIG. 12A.
Figure 12A:
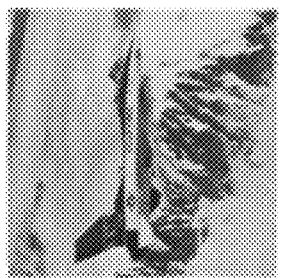
FIG. 12A shows a colour image in public domain.

2) Hiding of the Color Image:

For hiding of color image, the method in the present embodiment treats R (red) component, G (green) component, and B (blue) component in a color image separately. In other words, the R component of the public color image is used to hide the R component of the original private color image, the G component of the public color image is used to hide the G component of the original private color image, and the B component of the public color image is used to hide the B component of the original private color image. FIG. 12A is the independent public color image with the private color image and FIG. 12B is the private color image.

Figure 13B:
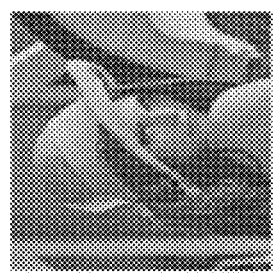
FIG. 13B shows the image of FIG. 12B overlaid with a pixel grid.
Figure 13A:
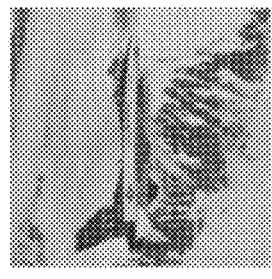
FIG. 13A shows the image of FIG. 12A overlaid with a pixel grid.

The method for processing a color image is as follows. First, the public and the private color images are each divided into 8×8 pixels block as shown in FIGS. 13A and 13B. For simplicity, the hiding and recovery of only the R component of the private color image is illustrated below. A person skilled in the art would appreciate that the same method applies to the B component and the G component. The respective blocked R component of the private and public color images is shown in FIGS. 14A and 14B.

The linearization method (a) of FIG. 4 is applied to each 8×8 pixels block of the blocked R component of private color image and the blocked R component of public color image. More particularly, the 0~1 sequence of each 8×8 pixels block is obtained from left to right, top to bottom, using the linearization method (a) of FIG. 4. The two R component images are then converted to respective Gaussian integer images based on the complex number basis (b=−1+i) using Algorithm 3. The first 8×8 pixels block in the upper left corner of the blocked R component of public color image is represented by Gaussian integer $Z_{cra1}$. The corresponding 8×8 pixels block in the blocked R component of private color image is represented by Gaussian integer $Z_{crb1}$.

The Gaussian integer for other 8×8 pixels blocks from left to right, top to bottom, in the private and public R component of color images can also be obtained. Gaussian integers obtained from the public R component of color image are arranged in a progression $Z_{cra}$. Gaussian integers obtained from the private R component of color image are arranged in a progression $Z_{crb}$. In this example let $Z_{crb}=Z_{crb1}-Z_{cra1}$ be the key of the first 8×8 pixels block. $Z_{crb1}$ is the first term of $Z_{crb}$ and $Z_{cra1}$ is the first term of $Z_{cra}$. The Gaussian integer progression of R component for the key is represented as $Z_{cr}=Z_{crb}-Z_{cra}$.

Figure 14B:
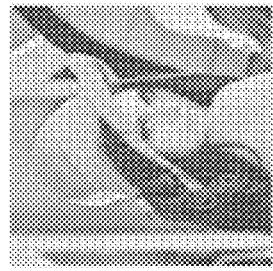
FIG. 14B shows the image of FIG. 13B with only one colour component.
Figure 14A:
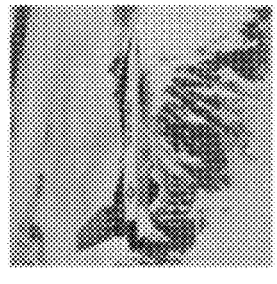
FIG. 14A shows the image of FIG. 13A with only one colour component.

The R component of private color image in FIG. 14B can be restored. As the progression $Z_{cr}$ and the R component of public color image in FIG. 14A are known, Algorithm 2 and Algorithm 3 are used to restore the R component of private color image. Each 8×8 pixels block corresponds to the corresponding Gaussian integer.

The same processing is applies to the G component of private color image and the B component of private color image. Accordingly the Gaussian integer progression $Z_{cg}$ of the G component for the key and the Gaussian integer progression $Z_{cb}$ of the B component for the key are also obtained, where $Z_{cg}=Z_{cgb}-Z_{cga}$ and $Z_{cb}=Z_{cbb}-Z_{cba}$. Gaussian integers obtained from the public G component of color image are arranged in a progression $Z_{cga}$. Gaussian integers obtained from the G component of color image are arranged in a progression $Z_{cgb}$. Gaussian integers obtained from the public B component of color image are arranged in a progression $Z_{cba}$. Gaussian integers obtained from the B component of color image are arranged in a progression $Z_{cbb}$. Algorithm 2 and Algorithm 3 are used to restore the G and B components of the private color image. And as such, the hiding and recovery of the private color image are implemented.

For simplicity, only the first, second, and third term in each progressions are provided below. Using Algorithm 3, the following can be obtained:

$Z_{cra}=\{-1.4458\times10^{76}-6.3196\times10^{76}i,-6.1816\times10^{76}-1.0699\times10^{77}i,-8.9864\times10^{75}+7.5359\times10^{76}i,\ldots\}$, the progression $Z_{cra}$ has 1024 terms.

$Z_{crb}=\{-3.0878\times10^{76}-2.3158\times10^{76}i,-2.3820\times10^{76}-3.0729\times10^{76}i,-7.7466\times10^{76}+2.2043\times10^{76}i,\ldots\}$, the progression $Z_{crb}$ has 1024 terms.

It follows that the key of the R component is:

$Z_{cr}=\{1.6420\times10^{76}+4.0038\times10^{76}i,3.7796\times10^{76}+7.5961\times10^{76}i,-6.8479\times10^{76}-5.3316\times10^{76}i,\ldots\}$, the progression $Z_{cr}$ has 1024 terms.

$Z_{cga}=\{-6.0821\times10^{76}-1.3117\times10^{76}i,-5.3586\times10^{76}-1.3428\times10^{76}i,-4.7221\times10^{76}-6.4984\times10^{76}i\ldots\}$, the progression $Z_{cga}$ has 1024 terms.

$Z_{cgb}=\{-6.9475\times10^{76}-6.9475\times10^{76}i,-6.1783\times10^{76}-7.5748\times10^{76}i,-5.4541\times10^{76}-6.2685\times10^{76}i,\ldots\}$, the progression $Z_{cgb}$ has 1024 terms.

And the key of the G component is:

$Z_{cg}=\{-0.8654\times10^{76}-5.6358\times10^{76}i,-0.8197\times10^{76}-6.2320\times10^{76}i,-0.7320\times10^{76}+0.2299\times10^{76}i,\ldots\}$, the progression $Z_{cg}$ has 1024 terms.

$Z_{cba}=\{-5.4008\times10^{76}-7.9972\times10^{76}i,-5.4063\times10^{76}-1.0165\times10^{77}i,-5.4515\times10^{76}-9.3082\times10^{76}i,\ldots\}$, the progression $Z_{cba}$ has 1024 terms.

$Z_{cbb}=\{-1.5439\times10^{76}i,-6.7750\times10^{75}+3.8117\times10^{76}i,2.5060\times10^{76}+2.4630\times10^{76}i,\ldots\}$, the progression $Z_{cbb}$ has 1024 terms.

And the key of the B component is:

$Z_{cb}=\{5.4008\times10^{76}+6.4533\times10^{76}i,-1.3687\times10^{76}+1.3977\times10^{77}i,7.9575\times10^{76}+1.1771\times10^{77}i,\ldots\}$, the progression $Z_{cb}$ has 1024 terms.

Figure 15:
FIG. 15 shows a greyscale image in private domain.
Figure 16D:
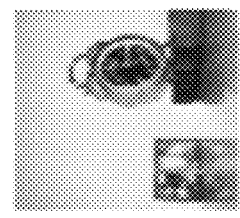
FIGS. 16A, 16B, 16C, and 16D show four greyscale images in public domain, the four greyscale images correspond to the image in FIG. 15.
Figure 16C:
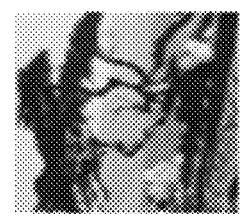
Figure 16B:
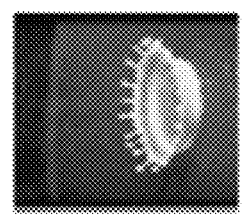
Figure 16A:
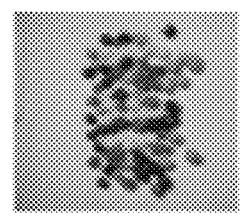

3) Hiding of One Grayscale Image to Multiple Grayscale Images:

FIG. 15 is the private image M sized 256×256 pixels. In one example, FIG. 15 may be divided it into four images (M1, M2, M3, M4), each having a size of 64×64 pixels. The four images correspond to four points ($Z_{M1}$, $Z_{M2}$, $Z_{M3}$, $Z_{M4}$) on the complex plane.

FIGS. 16A-16D shows the four public images (N1, N2, N3, N4). As shown in the Figures, all of them appear to have no correlation with the private image in FIG. 15. In one embodiment, a key $k_i=Z_{Mi}-Z_{Ni}$, i∈[1, 4] may be constructed. By using the method of the present embodiment on the public image Ni, the private Mi can be restored. This example illustrates that multiple images may be used to hide a private image. In one example, the multiple images may be disguised as one image.

The above embodiments of the present invention provide a data coding method, which utilizes the features of character coding in computer to hide information. In the above embodiments, the public information appears to have no correlation with the private information at all. This makes the key hard to crack. Some embodiments of the present invention further offer the following advantages:

Efficiency:

Generally, the larger the size of the multimedia information, the longer the calculating time would be. The methods in the present embodiments allow division of large sized multimedia information into smaller sizes of multimedia information. Although the resulting number of keys will increase, the calculating time can be substantially reduced.

Security:

The method in the present embodiments will not cause any change in the format of the information. This is because the hiding of the information is based on the complex number basis and the operational relations of points on the complex plane. As a result, the private multimedia information would not easily corrupt.

Robustness:

The method in the present embodiments is robust in that it uses complex number basis. Even when the public information and the key are obtained by an unauthorized party, the private information is still relatively difficult to crack when compared with existing solutions.

The present invention uses complex number as the basis in the positional number system. The present invention provides a data coding method for converting data of multimedia information and Gaussian integer using complex number basis. The data coding method can be extended to apply as a data hiding method, which is suitable not only for text, but also for audio, image, video, and other multimedia information. Other advantages of the present invention will become apparent to the person skilled in the art by referring to the above description and the appended drawings.

Although not required, the embodiments described with reference to the Figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the present invention are either wholly implemented by computing system or partly implemented by computing systems then any appropriate computing system architecture may be utilized. This will include stand-alone computers, network computers and dedicated hardware devices. Where the terms "computing system" and "computing device" are used, these terms are intended to cover any appropriate arrangement of computer hardware capable of implementing the function described.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method for coding data, comprising:
representing a first data in digital form as digital information;
transforming the digital information into a first Gaussian integer;
determining a relationship between the first Gaussian integer and a second Gaussian integer;
deriving, based on the determined relationship, a key for converting between the first Gaussian integer and the second Gaussian integer so as to associate the first data with a second data represented by the second Gaussian integer; and
converting the first data to the second data.

2. The method of claim 1, further comprising representing the first data using the second data represented by the second Gaussian integer so as to hide at least some of the first data.

3. The method of claim 1, wherein the relationship is a geometric relationship.

4. The method of claim 1, wherein the digital information is represented in one of: binary basis, octal basis, decimal basis, or hexadecimal basis.

5. The method of claim 1, wherein the transformation of the digital information into a Gaussian integer is based on complex number basis using complex numbers.

6. The method of claim 1, wherein the complex number basis has a base of $-1+i$ or $-1-i$.

7. The method of claim 1, wherein the key is a third Gaussian integer.

8. The method of claim 1, wherein the first data and the second data each comprises text, image, or audio.

9. The method of claim 8, wherein the image is a binary image; and the step of representing the first data in digital form as digital information comprises representing each pixel of the binary image using binary numbers.

10. The method of claim 8, wherein the image is a greyscale image; and the step of representing the first data in digital form as digital information comprises representing each pixel of the greyscale image using binary numbers.

11. The method of claim 8, wherein the image is a colour image; and the step of representing the first data in digital form as digital information comprises decomposing each pixel of the colour image into at least two separate colour components, and representing the at least two separate colour components of each pixel using binary numbers.

12. The method of claim 8, wherein the first data is text that comprises at least one of: a Chinese character, an English alphabet, a number, and a graphical symbol.

13. The method of claim 12, wherein the text is a Chinese character; and the step of representing the first data in digital form as digital information comprises representing the Chinese character using internal code with hexadecimal basis.

14. The method of claim 12, wherein the text is an English alphabet, a number, or a graphical symbol; and the step of representing the first data in digital form as digital information comprises representing the English alphabet, the number, or the graphical symbol using an ASCII code with binary basis.

15. The method of claim 8, wherein the audio is a digitized audio signal represented in voltage value; and the step of representing the first data in digital form as digital information comprises representing the digitized audio signal in a binary sequence using SQL code.

16. The method of claim 1, wherein the first data represented by the first Gaussian integer and the second data represented by the second Gaussian integer are of the same type.

17. A method for coding data, comprising:
   representing a first data in digital form as digital information;
   transforming the digital information into a first Gaussian integer; and
   determining a relationship between the first Gaussian integer and a second Gaussian integer;
   deriving, based on the determined relationship, a key for converting between the first Gaussian integer and the second Gaussian integer so as to associate the first data with a second data represented by the second Gaussian integer; and
   representing the first data using the second data represented by the second Gaussian integer so as to hide at least some of the first data.

18. The method of claim 17, wherein the first data and the second data comprises:
   (i) text that comprises at least one of: a Chinese character, an English alphabet, a number, and a graphical symbol,
   (ii) image that comprises at least one of: binary image, a greyscale image, and a colour image; or
   (iii) audio;
   wherein when the image is a colour image, the step of representing the first data in digital form as digital information comprises:
      decomposing each pixel of the colour image into at least two separate colour components, and
      representing the at least two separate colour components of each pixel using binary numbers;
   wherein when the audio is a digitized audio signal represented in voltage value, the step of representing the first data in digital form as digital information comprises representing the digitized audio signal in a binary sequence using SQL code.

19. A method for coding data, comprising:
   representing a first data in digital form as digital information;
   transforming the digital information into a first Gaussian integer; and
   determining a relationship between the first Gaussian integer and a second Gaussian integer; and
   deriving, based on the determined relationship, a key for converting between the first Gaussian integer and the second Gaussian integer so as to associate the first data with a second data represented by the second Gaussian integer;
   wherein the first data represented by the first Gaussian integer and the second data represented by the second Gaussian integer are of the same type.

20. The method of claim 19, wherein the first data and the second data comprises
   (i) text that comprises at least one of: a Chinese character, an English alphabet, a number, and a graphical symbol,
   (ii) image that comprises at least one of: binary image, a greyscale image, and a colour image; or
   (iii) audio;
   wherein when the image is a colour image, the step of representing the first data in digital form as digital information comprises:
      decomposing each pixel of the colour image into at least two separate colour components, and
      representing the at least two separate colour components of each pixel using binary numbers;
   wherein when the audio is a digitized audio signal represented in voltage value, the step of representing the first data in digital form as digital information comprises representing the digitized audio signal in a binary sequence using SQL code.

* * * * *